(12) United States Patent
Honnavara-Prasad

(10) Patent No.: US 10,516,383 B1
(45) Date of Patent: Dec. 24, 2019

(54) REDUCING POWER CONSUMPTION IN A PROCESSOR CIRCUIT

(71) Applicant: Groq, Inc., Menlo Park, CA (US)

(72) Inventor: Sushma Honnavara-Prasad, San Jose, CA (US)

(73) Assignee: Groq, Inc., Mountain View, CA (US)

(*) Notice: Subject to any disclaimer, the term of this patent is extended or adjusted under 35 U.S.C. 154(b) by 0 days.

(21) Appl. No.: 16/112,564

(22) Filed: Aug. 24, 2018

(51) Int. Cl.
| G11C 15/00 | (2006.01) |
| H03K 3/012 | (2006.01) |
| H03K 19/00 | (2006.01) |
| G06F 1/324 | (2019.01) |
| H03K 3/037 | (2006.01) |

(52) U.S. Cl.
CPC ............ H03K 3/012 (2013.01); G06F 1/324 (2013.01); H03K 3/037 (2013.01); H03K 19/0016 (2013.01)

(58) Field of Classification Search
CPC .... H03K 3/012; H03K 3/037; H03K 19/0016; G06F 1/324
USPC ..................................................... 365/49.11
See application file for complete search history.

(56) References Cited

U.S. PATENT DOCUMENTS

| 6,351,808 | B1 | 2/2002 | Joy et al. | |
| 7,884,649 | B1 * | 2/2011 | Savoj | G06F 17/5031 |
| | | | | 326/93 |

OTHER PUBLICATIONS

Hyoungseok, M. et al., "Loosely coupled multi-bit flip-flop allocation for power reduction," Integration, vol. 58, Mar. 23, 2017, pp. 125-133.
PCT International Search Report and Written Opinion, PCT Application No. PCT/US2019/047332, Oct. 31, 2019, 14 pages.
Wimer, S. et al., "On optimal flip-flop grouping for VLSI power minimization," Operations Research Letters, vol. 41, No. 5, Jun. 14, 2013, pp. 486-489.
Wimer, S. et al., "Using well-solvable minimum cost exact covering for VLSI clock energy minimization," Operations Research Letters, vol. 42, No. 5, Jun. 10, 2014, pp. 332-336.

* cited by examiner

*Primary Examiner* — Huan Hoang
(74) *Attorney, Agent, or Firm* — Fenwick & West LLP

(57) ABSTRACT

Embodiments of the present disclosure pertain to reducing power consumption in a processor circuit. In one embodiment, a processor circuit comprises a plurality of data storage modules. The plurality of data storage modules each include one or more first multibit flip flop circuits having a first power consumption per bit and one or more second flip flop circuits having a second power consumption per bit. The first multibit flip flop circuits may have more bits than the second flip flop circuits. Additionally, the first power consumption per bit may be less than the second power consumption per bit such that power consumption is reduced when the first multibit flip flop circuits are used to store bits that change with a higher frequency than bits stored in the second flip flop circuits.

16 Claims, 4 Drawing Sheets

US 10,516,383 B1

REDUCING POWER CONSUMPTION IN A PROCESSOR CIRCUIT

BACKGROUND

The present disclosure relates to data processing circuits, and in particular, to reducing power in a processor circuit.

A basic building block of data processors is the flip flop. A flip flop is an electronic circuit that may be in one of two states, corresponding to a binary 0 or 1. Thus, these circuits are used extensively in processors to store binary information. FIG. 1 shows a number flip flops 100-103 configured to receive N binary data values, D0-DN, store the binary values, and output the values, Q1-QN to another part of the circuit. As is typically the case, flip flops often receive new data values D0-DN at the same time in response to a trigger signal (e.g., a clock).

In data processing circuits, the use of flip flops to store data is ubiquitous. Modern processor circuits may include hundreds of thousands, millions, or tens of millions of flip flops. However, every time a flip flop changes state, wherein the output goes from low to high, the flip flop consumes power. Scaled across an entire processor, flip flops can consume a large amount of energy. This is particularly true in processors that use flip flops to perform intense data calculations, such as artificial intelligence processors, for example.

The present disclosure provides improved architectures for processors with reduced power consumption.

SUMMARY

Embodiments of the present disclosure pertain to reducing power consumption in a processor circuit. In one embodiment, a processor circuit comprises a plurality of data storage modules. The plurality of data storage modules each include one or more first multibit flip flop circuits having a first power consumption per bit and one or more second flip flop circuits having a second power consumption per bit. The first multibit flip flop circuits may have more bits than the second flip flop circuits. Additionally, the first power consumption per bit may be less than the second power consumption per bit such that power consumption is reduced when the first multibit flip flop circuits are used to store bits that change with a higher frequency than bits stored in the second flip flop circuits.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Features and advantages of the present disclosure include a data storage module that may be used in a processor circuit to reduce power consumption. In one embodiment, a data storage module is configured to store different types of data bits in different flip flop circuits. Different flip flop circuits may consume different power when they toggle (e.g., from logic 0, or ground, to logic 1, or a power supply voltage). Advantageously, data bits that toggle with a higher frequency may be stored in flip flop circuits that consume less power (e.g., and may be slower), and data bits that toggle with a lower frequency may be stored in flip flops circuits that consume more power (e.g., yet may be faster). Data bits stored in flip flops that consume more power may be in a critical signal processing path of an arithmetic operation circuit, for example. Such flip flop circuits and bit assignments may be configured in a data storage module, and the data storage module may be deployed across a processor circuit to reduce the power consumed by the processor during operation.

Figure 1:
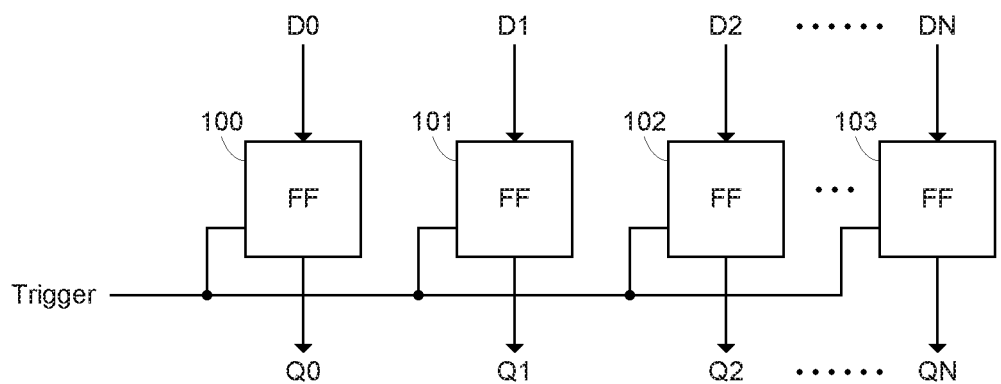
FIG. 1 illustrates a typical flip flop circuit.
Figure 2:
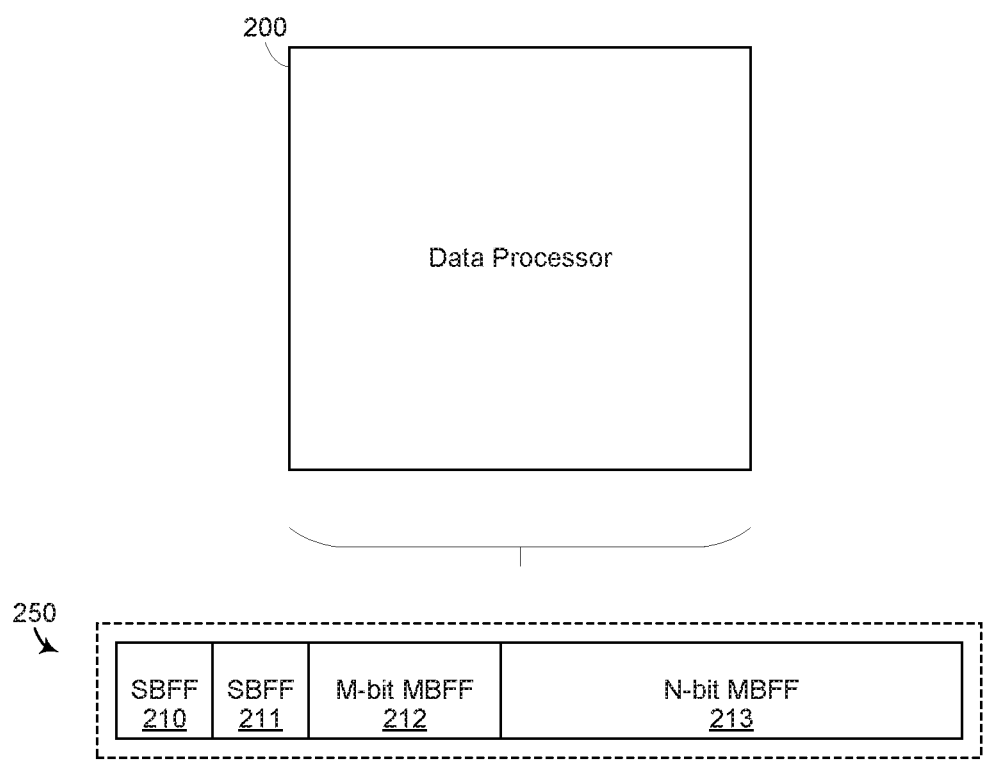
FIG. 2 illustrates a data storage module according to one embodiment.

FIG. 2 illustrates a data storage module according to one embodiment. A data processor circuit 200 may have numerous data storage modules implemented across the chip for a wide range of applications, for example, to achieve improved power performance. An example data storage module is illustrated at 250. Each data storage module may comprise multibit flip flop circuits (MBFF), which are designed to use less power per bit (e.g., when toggled), and one or more single bit flip flop circuits (SBFF), which may be faster than the MBFFs, but which consume more power per bit than the MBFFs, for example. More specifically, example SBFFs may include scan circuitry and a clock buffer. For MBFF structures, scan-circuitry can be shared across the "flop elements" in a 2-bit and 4-bit case, for example. Further, clock buffers may also be shared in a MBFF. Accordingly, MBFF cell area and power consumption may be lower than a SBFF. Additionally, MBFF cell area may be lower for a 4-bit MBFF than for a 2-bit MBFF, for example.

Data module 250 illustrates various combinations of SBFFs and MBFFs that may be combined according to various embodiments to optimize power performance. For example, data module 250 includes SBFFs 210 and 211, an M-bit MBFF 212, and an N-bit MBFF 213. MBFF 213 may be used to store bits that change with a higher frequency than bits stored in the other flip flop circuits. Power consumption across the processor circuit is reduced when bits that change with a higher frequency are stored in a MBFF, which consumes less power, and bits that change with a lower frequency are stored in a SBFF, which consumes more power, for example. Two SBFFs 210 and 211 and two MBFFs 212 and 213 are shown here for illustrative purposes only. It is to be understood that other combinations of SBFFs and MBFFs may be used for data modules storing different numbers of bits and/or different types of bits.

FIG. 2 further illustrates that different bit length MBFFs may be used to further optimize power consumption. For example, a SBFF may consume more power per bit when toggled than a MBFF. However, an M-bit MBFF 212 may be designed consume more power per bit when toggled than an N-bit MBFF 213, where M and N are integers and N is greater than M. For example, a four-bit MBFF may consume less power when toggled than a two-bit MBFF. Accordingly, higher order MBFFs (e.g., N-bit MBFFs) may be combined with lower order flip flops (e.g., M-bit MBFFs or SBFFs) to flexibly achieve reduced power consumption across various data storage module variations, for example, where higher order MBFFs have a power consumption per bit that is less than the power consumption per bit of lower order MBFFs, and lower order MBFFs have a power consumption per bit that is less than the power consumption per bit of the SBFFs, and where higher order MBFFs store bits that may change with a higher frequency than bits stored in lower order MBFFs, and lower order MBFFs store bits that may change with a higher frequency than bits stored in SBFFs, for example.

Figure 3:
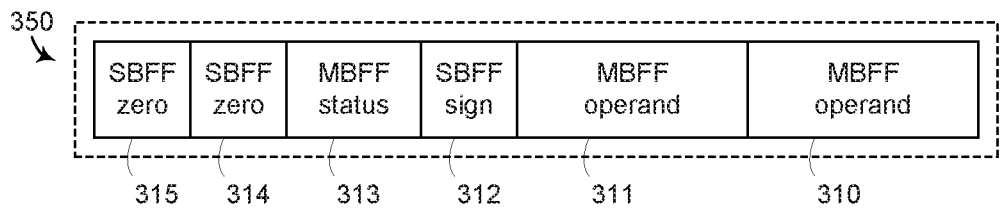
FIG. 3 illustrates an example data storage module according to one embodiment.
Figure 4:
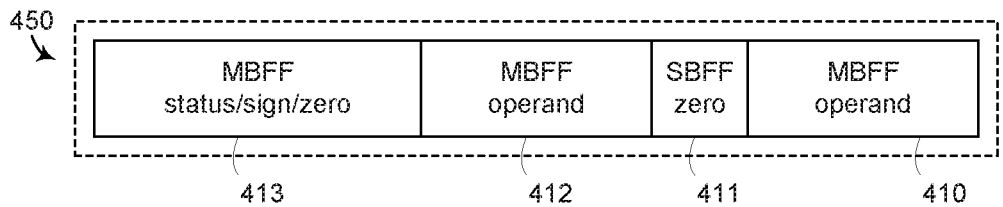
FIG. 4 illustrates another example data storage module according to one embodiment.

FIG. 3 illustrates an example data storage module according to one embodiment. In this example, different flip flop circuits may store different types of data bits. In one embodiment, a data storage module 350 may have bits corresponding to one or more operands, a sign bit, status bits, and zero indicator bits (aka zero detection bits). For example, one or more MBFFs 310 and 311 may store one or more operands. SBFF 312 may store a sign bit for an 8-bit or 16-bit operand, for example. MBFF 313 may store a plurality of status bits. Furthermore, some embodiments may include one or more zero indicator bits, which in this example are stored in SBFFs 314 and 315. Zero indicator bits may have a first state (e.g., logic 0) when a corresponding operand is all zero values, and the zero indicator bit may have a second state (e.g., logic 1) when the corresponding operand has at least one nonzero value, for example. In this example, a first zero indicator bit in SBFF 314, for example, may correspond to one operand stored in the data storage module, and the second zero indicator bit in SBFF 315, for example, may correspond to a second operand in the data storage module (e.g., when the data storage modules stores two operands). Alternatively, one zero indicator bit may correspond to one operand when the data storage module stores only one operand, and the other zero indicator bit may be unused. In some applications, operands may change at a higher frequency than one or more of the sign bits, status bits, and/or zero indicator bits. Thus, some embodiments may store operands in higher order MBFFs and store sign bits, status bits, and/or zero indicator bits in lower order MBFFs or SBFFs, for example, to consumer less power during operation. Least significant bits (LSBs) may change with a higher frequency than most significant bits (MSB). Thus, LSBs may be stored in higher order MBFFs, and MSBs may be stored in lower order MBFFs or SBFFs, for example. The particular data bit types stored in data storage module 350 are merely examples. It is to be understood that other arrangements of MBFFs and SBFFs, for example, may be assigned to store other data bit types. FIG. 4 illustrates a variation where MFBB 410 stores an operand, SBFF 411 stores a zero indicator bit, MBFF 412 stores an operand, and MBFF 413 stores status, sign, and another zero indicator bit, for example.

Figure 5:
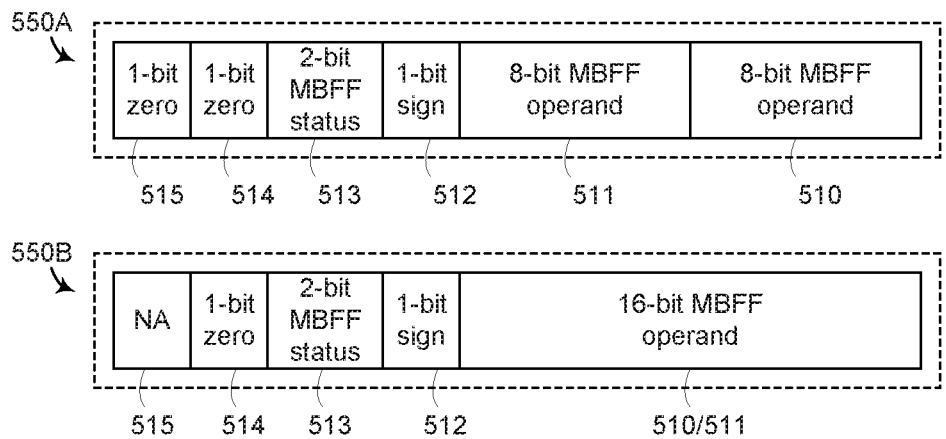
FIG. 5 illustrates another example data storage module according to one embodiment.

FIG. 5 illustrates another example data storage module according to one embodiment. Another aspect of the present disclosure includes data storage modules that may be multipurpose modules for alternatively storing different length operands. For example, FIG. 5 illustrates one example multipurpose data storage module configured to store either two eight-bit operands, in module 550A, or one sixteen-bit operand, in module 550B. Data storage module configuration 550A may store a first eight-bit operand in MBFFs 510 (e.g., two 4-bit MBFFs) and a second eight-bit operand in MBFFs 511 (e.g., another two 4-bit MBFFs). Data storage module configuration 550A may further store a sign bit in SBFF 512, status bits in a 2-bit MBFF 513, and two zero indicator bits in SBFFs 514 and 515. Alternatively, the data storage module may be configured as shown in 550B to store one 16-bit operand in MBFFs 510/511 (e.g., four 4-bit MBFFs). Data storage module configuration 550B may further store a sign bit in SBFF 512, status bits in a 2-bit MBFF 513, and one zero indicator bit in SBFF 514, where SBFF 515 may be unused for this configuration, for example.

Figure 6:
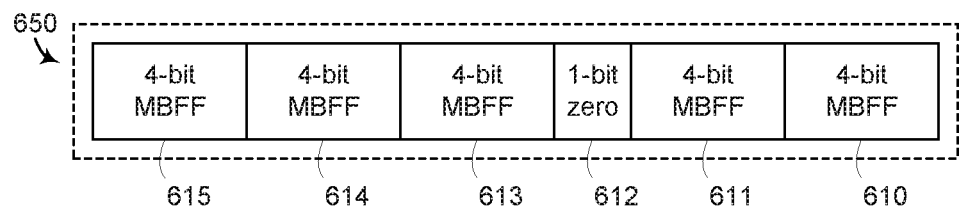
FIG. 6 illustrates an example 21-bit format data storage module according to one embodiment.

FIG. 6 illustrates an example 21-bit format data storage module according to one embodiment. In this example, 4-bit MBFF 610 stores bits 3:0, 4-bit MBFF 611 stores bits 7:4, a 1-bit SBFF 612 stores a first zero detection bit (bit 8), 4-bit MBFF 613 stores bits 12:9, 4-bit MBFF 614 stores bits 16:13, and 4-bit MBFF 615 stores bits 20:17. In this example, bits 8 and 20 are zero detection bits, which changes at a much lower frequency than the rest. Bits 17-19 are status bits that also change less frequently. However, since bits 20-17 can be grouped in one 4-bit MBFF, the present example advantageously reduces the area used to realize the circuit, for example. In this example, bits 0:7 are used together and bits 9:20 are used differently, so the present configuration may optimize area and power consumption, for example.

Figure 7:
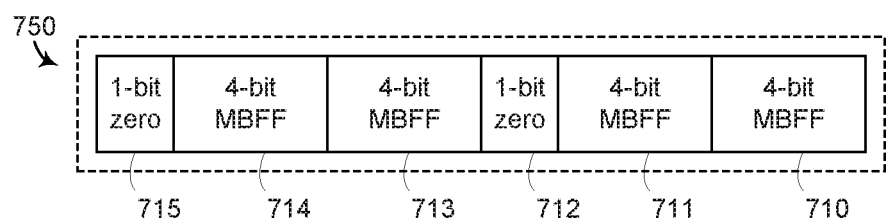
FIG. 7 illustrates an example 18-bit format data storage module according to one embodiment.

FIG. 7 illustrates an example 18-bit format data storage module according to one embodiment. In this example, 4-bit MBFF 710 stores bits 3:0, 4-bit MBFF 711 stores bits 7:4, a 1-bit SBFF 712 stores a first zero detection bit (bit 8), 4-bit MBFF 713 stores bits 12:9, 4-bit MBFF 714 stores bits 16:13, and 1-bit SBFF 715 stores a second zero detection bit (bit 17).

Figure 8:
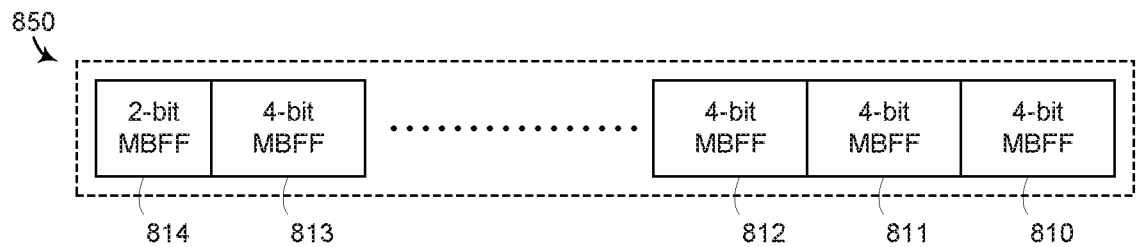
FIG. 8 illustrates an example 138-bit format data storage module according to one embodiment.

FIG. 8 illustrates an example 138-bit format data storage module according to one embodiment. In this example, 4-bit MBFF 810 stores bits 3:0, 4-bit MBFF 811 stores bits 7:4, and so on to 4-bit MBFF 813 which stores bits 135:132, and 2-bit MBFF which stores bits 137:136. In this example, bits 137:136 are the most significant bits, which statistically toggle less frequently. One issue with this example is that 138 is not divisible by 4, but 136 is. The last 2 left-over bits may then be reduced to a 2-bit MBFF.

Figure 9:
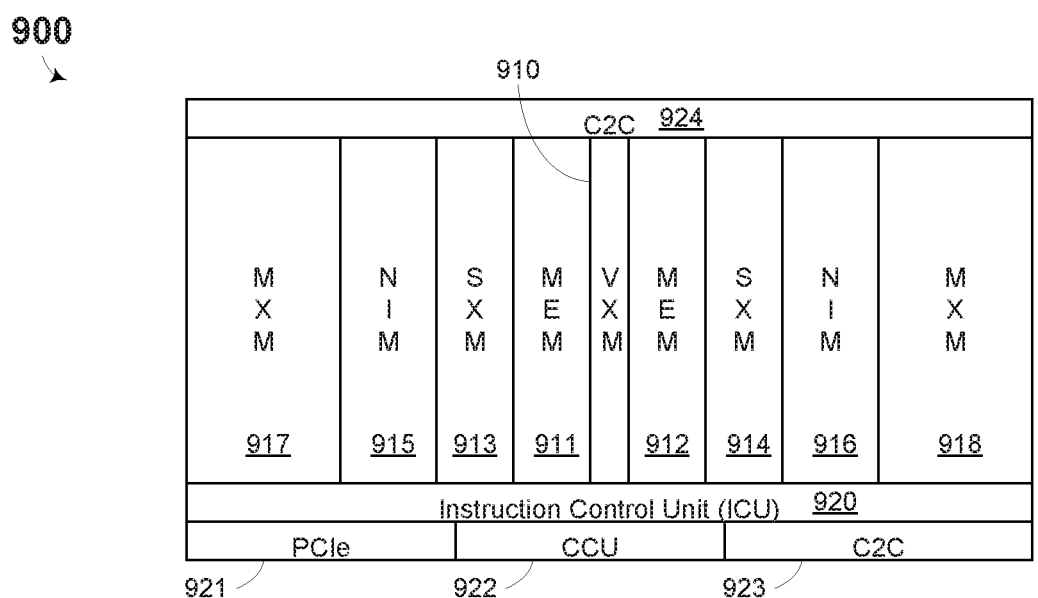
FIG. 9 illustrates an example machine learning processor according to one embodiment.

FIG. 9 illustrates an example machine learning processor according to one embodiment. Machine learning processor 900 (aka, Artificial Intelligence (AI) processor) may include memory and arithmetic units optimized for multiplying and adding input data with weight sets (e.g., trained or being trained) for machine learning applications (e.g., training or inference). For example, machine learning processor 900 includes a vector processor (V×M) 910 for performing operations on vectors (i.e., one-dimensional arrays of values). Other elements of the system are arranged symmetrically on either side of the V×M 910 to optimize processing speed. For example, V×M 910 is adjacent to memories 911 and 912, switch matrices (S×M) 913 and 914 to control routing of data, data format and presentation controllers (NIM) 915 and 916, and a matrix multiplication unit (M×M)

917 and 918. An instruction control unit (ICU) 920 controls the flow of data and execution of operations across blocks 910-918, for example. Machine learning processor 900 includes communications circuits such as chip-to-chip (C2C) circuits 923-924 and an external communication circuit (e.g., PCIe) 921. Processor 900 may further include a chip control unit (CCU) 922 to control boot operations, clock resets, and other low level setup operations, for example.

In a machine learning processor, speed and power consumption tradeoffs may not be the same as in a typical microprocessor architecture because a machine learning processor may perform far more arithmetic operations, such as vector and matrix multiplication. Accordingly, embodiments of the disclosure described above may result in unexpectedly large reductions in power consumption compared to a typical microprocessor. In one embodiment, data storage modules may be implemented in a wide range of applications across machine learning processor 900 to reduce power consumption. For example, data storage modules according to the embodiments described above may be used extensively in the M×M and V×M units to reduce power consumption of the chip, for example. Advantageously, once implemented, the processor may be analyzed to determine where bits are switching more often or less often. Based on usage statistics, for example, the data storage module may be modified to reduce power consumption by associating bits that change at a higher frequency with MBFFs and associating bits that change less often, and/or are in a critical processing path, with lower order MBFFs or SBFFs, for example. A change to a data storage module definition, for example, may cause all the instances of the data storage module to be changed across the entire processor, thus promulgating and multiplying the reduction in power consumption.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A processor circuit comprising:
a plurality of data storage modules, the plurality of data storage modules each comprising:
one or more first multibit flip flop circuits having a first power consumption per bit; and
one or more second flip flop circuits having a second power consumption per bit;
wherein the first multibit flip flop circuits have more bits than the second flip flop circuits,
wherein the first power consumption per bit is less than the second power consumption per bit, and
wherein the first multibit flip flop circuits are used to store bits that change with a higher frequency than bits stored in the second flip flop circuits.

2. The processor of claim 1 wherein the second flip flop circuits are second multibit flip flop circuits, wherein the data storage modules further comprise a plurality of single bit flip flop circuits having a third power consumption per bit, wherein the second power consumption per bit is less than the third power consumption per bit, and wherein the second multibit flip flop circuits are used to store bits that change with a higher frequency than bits stored in the plurality of single bit flip flop circuits.

3. The processor of claim 2 wherein the data storage modules are multipurpose modules for storing two eight-bit operands or one sixteen-bit operand, wherein the first multibit flip flop circuits comprise four four-bit multibit flip flop circuits for storing either the two eight-bit operands or one sixteen-bit operand, and wherein each data storage module comprises at least one single bit flip flop circuit of said plurality of single bit flip flop circuits for storing one of a first zero indicator bit or a second zero indicator bit.

4. The processor of claim 3 wherein:
the first zero indicator bit corresponds to a first eight-bit operand and the second zero indicator bit corresponds to a second eight-bit operand when the data storage modules stores two eight-bit operands;
the first zero indicator bit corresponds to the sixteen-bit operand when the data storage modules stores a sixteen-bit operand, and the second zero indicator bit is unused; and
each zero indicator bit has a first state when the corresponding operand is all zero values, and each zero indicator bit has a second state when the corresponding operand has at least one nonzero value.

5. The processor of claim 1 wherein first bits in one or more of the second flip flop circuits are in a critical processing path of an arithmetic operation circuit.

6. The processor of claim 1 wherein the processor is a machine learning processor.

7. The processor of claim 6 wherein the machine learning processor comprises one or more matrix multiplication units, and wherein the one or more matrix multiplication units comprise a plurality of said data storage modules.

8. The processor of claim 6 wherein the machine learning processor comprises one or more vector multiplication units, and wherein the one or more vector multiplication units comprise a plurality of said data storage modules.

9. A processor comprising:
a plurality of data storage modules, the plurality of data storage modules each comprising:
first means for storing a plurality of bits, the first means having a first power consumption per bit; and
second means for storing one or more bits, the second means having a second power consumption per bit;
wherein the first power consumption per bit is less than the second power consumption per bit, and
wherein the first means stores bits that change with a higher frequency than bits stored in the second means.

10. The processor of claim 9 wherein the first means is a plurality of first multibit flip flop circuits for storing operands and the second means is one or more second multibit flip flop circuits or single bit flip flop circuits for storing zero indicator bits.

11. A method of processing data comprising:
storing data in a plurality of data storage modules on a processor, wherein storing data in each of the plurality of data storage modules comprising:
storing data in one or more first multibit flip flop circuits having a first power consumption per bit; and
storing data in one or more second flip flop circuits having a second power consumption per bit;
wherein the first multibit flip flop circuits store more bits than the second flip flop circuits,
wherein the first power consumption per bit is less than the second power consumption per bit, and wherein the first multibit flip flop circuits are used to store bits that change with a higher frequency than bits stored in the second flip flop circuits.

12. The method of claim 11 wherein the processor is a machine learning processor comprising one or more of a matrix multiplication unit or vector multiplication unit, and wherein the matrix multiplication unit or vector multiplication unit comprise a plurality of said data storage modules.

13. The method of claim 11 wherein the second flip flop circuits are second multibit flip flop circuits, wherein method further comprises storing data in a plurality of single bit flip flop circuits having a third power consumption per bit, wherein the second power consumption per bit is less than the third power consumption per bit, and wherein the second multibit flip flop circuits are used to store bits that change with a higher frequency than bits stored in the plurality of single bit flip flop circuits.

14. The method of claim 13 wherein the data storage modules are multipurpose modules for storing two eight-bit operands or one sixteen-bit operand, wherein the first multibit flip flop circuits comprise four four-bit multibit flip flop circuits for storing either the two eight-bit operands or one sixteen-bit operand, and wherein each data storage module comprises at least one single bit flip flop circuit of said plurality of single bit flip flop circuits for storing one of a first zero indicator bit or a second zero indicator bit.

15. The method of claim 14 wherein:
the first zero indicator bit corresponds to a first eight-bit operand and the second zero indicator bit corresponds to a second eight-bit operand when the data storage modules stores two eight-bit operands;
the first zero indicator bit corresponds to the sixteen-bit operand when the data storage modules stores a sixteen-bit operand, and the second zero indicator bit is unused; and
each zero indicator bit has a first state when the corresponding operand is all zero values, and each zero indicator bit has a second state when the corresponding operand has at least one nonzero value.

16. The method of claim 11 wherein first bits in one or more of the second flip flop circuits are in a critical processing path of an arithmetic operation circuit.

* * * * *

UNITED STATES PATENT AND TRADEMARK OFFICE
CERTIFICATE OF CORRECTION

PATENT NO. : 10,516,383 B1
APPLICATION NO. : 16/112564
DATED : December 24, 2019
INVENTOR(S) : Sushma Honnavara-Prasad It is certified that error appears in the above-identified patent and that said Letters Patent is hereby corrected as shown below:

In the Claims

Column 7, Claim 12, Line 8 delete "unit comprise a plurality" and insert --unit comprises a plurality--.

Signed and Sealed this
Eighth Day of September, 2020

Andrei Iancu
*Director of the United States Patent and Trademark Office*